(12) United States Patent
Nagumo et al.

(10) Patent No.: US 11,336,309 B2
(45) Date of Patent: May 17, 2022

(54) FRONT-END MODULE AND COMMUNICATION DEVICE

(71) Applicant: Murata Manufacturing Co., Ltd., Kyoto (JP)

(72) Inventors: Shoji Nagumo, Kyoto (JP); Kanta Motoki, Kyoto (JP); Shiyunsuke Ootomo, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 252 days.

(21) Appl. No.: 16/784,531

(22) Filed: Feb. 7, 2020

(65) Prior Publication Data
US 2020/0177214 A1    Jun. 4, 2020

Related U.S. Application Data

(63) Continuation of application No. PCT/JP2018/028656, filed on Jul. 31, 2018.

(30) Foreign Application Priority Data

Aug. 10, 2017 (JP) ............................. JP2017-155164

(51) Int. Cl.
*H04B 1/00*    (2006.01)
*H03F 3/19*    (2006.01)

(52) U.S. Cl.
CPC ............. *H04B 1/0057* (2013.01); *H03F 3/19* (2013.01); *H04B 1/0064* (2013.01); *H03F 2200/451* (2013.01)

(58) Field of Classification Search
CPC ........ B62D 25/085; H04B 1/00; H04B 1/006; H04B 1/40; H04B 1/0057; H04B 1/0064;
(Continued)

(56) References Cited

U.S. PATENT DOCUMENTS 9,203,596 B2 * 12/2015 Granger-Jones ...... H04L 5/0005
9,337,990 B2 *  5/2016 Narahashi ............. H04L 5/1461
(Continued)

FOREIGN PATENT DOCUMENTS

| JP | 2016-501467 A | 1/2016 |
| WO | 2014/010575 A1 | 1/2014 |
| WO | 2014/109111 A1 | 7/2014 |

OTHER PUBLICATIONS

International Search Report for International Application No. PCT/JP2018/028656, dated Sep. 4, 2018.
(Continued)

*Primary Examiner* — Marsha D Banks Harold
*Assistant Examiner* — Dharmesh J Patel
(74) *Attorney, Agent, or Firm* — Pearne & Gordon LLP

(57) ABSTRACT

A front-end module includes: a first front-end circuit that transmits signals in a first band in a CA mode; and a second front-end circuit that transmits signals in a second band in the CA mode. The second front-end circuit includes a second quadplexer for the first and second bands. The first front-end circuit includes: a first quadplexer for the first and second bands; and an impedance variable circuit that is connected to a transmission terminal that is included in the first quadplexer and corresponds to the second band. In the CA mode, the impedance variable circuit serves as a reflection circuit that causes reflection of transmission waves in the second band. In a non-CA mode, the impedance variable circuit serves as a matching circuit that transmits or absorbs transmission waves in the second band.

20 Claims, 7 Drawing Sheets

EXAMPLE 1

(58) Field of Classification Search
CPC ......... H04B 1/525; H04B 13/00; H03F 1/223;
H03F 2200/451; H03F 3/19; H03F 3/68;
H03F 3/193; H03H 7/38; H03H 7/46;
H04L 5/0005; H04L 5/08; H04L 5/1461;
H04L 24/08; H04L 27/2647; H04W 88/06
See application file for complete search history.

(56) References Cited

U.S. PATENT DOCUMENTS

| | | | |
|---|---|---|---|
| 2014/0133364 A1* | 5/2014 | Weissman | H04B 1/006 370/273 |
| 2014/0321312 A1 | 10/2014 | Narahashi et al. | |
| 2015/0318890 A1 | 11/2015 | Uejima | |
| 2016/0233895 A1* | 8/2016 | Khlat | H04B 1/0057 |

OTHER PUBLICATIONS

Written Opinion for International Application No. PCT/JP2018/028656, dated Sep. 4, 2018.

\* cited by examiner

FRONT-END MODULE AND COMMUNICATION DEVICE

This is a continuation of International Application No. PCT/JP2018/028656 filed on Jul. 31, 2018 which claims priority from Japanese Patent Application No. 2017-155164 filed on Aug. 10, 2017. The contents of these applications are incorporated herein by reference in their entireties.

BACKGROUND

The present disclosure relates to a front-end module and a communication device that process radio-frequency signals.

There is a demand that the carrier aggregation (CA) scheme involving simultaneous use of different frequency bands finds application to front-end modules having multi-band and multi-module features.

Japanese Unexamined Patent Application Publication (Translation of PCT Application) No. 2016-501467 discloses an antenna interface circuitry that simultaneously transmits and simultaneously receives signals in different frequency bands through two antennas. More specifically, the antenna interface circuitry includes a first antenna interface circuit coupled to a first antenna and a second antenna interface circuit coupled to a second antenna. The first antenna interface circuit includes a first quadplexer for first and second bands. The second antenna interface circuit includes a second quadplexer for the first and second bands. It has been pointed out that this configuration enables simultaneous transmission of signals in a first band and signals in a second band (two uplinks).

When, for example, the antenna interface circuitry that is disclosed in Japanese Unexamined Patent Application Publication (Translation of PCT Application) No. 2016-501467 and is capable of two uplinks performs simultaneous transmission, first-band transmission signals transmitted through the first antenna interface circuit may flow through the two antennas and may leak into the second antenna interface circuit, in which the transmission signals may interfere with second-band transmission signals transmitted through the second antenna interface circuit and may consequently cause intermodulation distortion in the second quadplexer.

In particular, when the first band and the second band are in the same (frequency) band group and signals in the first band and signals in the second band are transmitted simultaneously, leakage transmission signals in the first band attenuate between the two antennas but do not attenuate in the second antenna interface circuit. As a result, the reception sensitivity in the second band may degrade due to intermodulation distortion components resulting from interference between the leakage signals and transmission signals in the second band.

BRIEF SUMMARY

The present disclosure provides a front-end module and a communication device capable of mitigating degradation of reception sensitivity by reducing intermodulation distortion in a CA mode that involves simultaneous transmission of signals in two frequency bands.

According to an aspect of the present disclosure, a front-end module supports a carrier aggregation (CA) mode that involves simultaneous transmission of signals in a first frequency band and signals in a second frequency band. The first frequency band and the second frequency band are different frequency bands belonging to a first frequency band group. The front-end module includes: a first circuit that selectively transmits signals in the first frequency band when the CA mode is selected; a second circuit that selectively transmits signals in the second frequency band when the CA mode is selected; and a first switch disposed between each of two or more antennas and each of the first and second circuits to switch between connections formed between each of the two or more antennas and each of the first circuit and the second circuit. The first circuit includes a first multiplexer including: (1) a first transmitting filter connected to a first common terminal and to a first transmission terminal, a pass band of the first transmitting filter being a first transmission band included in the first frequency band; (2) a first receiving filter connected to the first common terminal and to a first reception terminal, a pass band of the first receiving filter being a first reception band included in the first frequency band; (3) a second transmitting filter connected to the first common terminal and to a second transmission terminal, a pass band of the second transmitting filter being a second transmission band included in the second frequency band; and (4) a second receiving filter connected to the first common terminal and to a second reception terminal, a pass band of the second receiving filter being a second reception band included in the second frequency band. The second circuit includes a second multiplexer including: (1) a third transmitting filter connected to a second common terminal and to a third transmission terminal, a pass band of the third transmitting filter being the first transmission band; (2) a third receiving filter connected to the second common terminal and to a third reception terminal, a pass band of the third receiving filter being the first reception band; (3) a fourth transmitting filter connected to the second common terminal and to a fourth transmission terminal, a pass band of the fourth transmitting filter being the second transmission band; and (4) a fourth receiving filter connected to the second common terminal and to a fourth reception terminal, a pass band of the fourth receiving filter being the second reception band. The first circuit further includes an impedance variable circuit connected to the second transmission terminal to cause, in the CA mode, reflection of signal components in the second transmission band that are transmitted from the first switch toward the first multiplexer.

When supporting the CA mode involving simultaneous transmission of transmission signals in two frequency bands (the first frequency band and the second frequency band) belonging to the same frequency band group, the front-end system is to be capable of transmitting, in the CA mode, transmission signals in the two frequency bands through respective signal paths. More specifically, transmission signals and reception signals in the first frequency band are transmitted through the first circuit, and transmission signals and reception signals in the second frequency bands are transmitted through the second circuit. Isolation between a transmission signal in the first frequency band and a transmission signal in the second frequency band may be provided solely by the two or more antennas and the first switch. It is difficult to provide additional isolation through, for example, a wave separator used to separate signals into signals in one frequency band group and signals in another frequency band group. Thus, insufficiently attenuated signal components in the second transmission band may enter the first circuit through the first switch and the two or more antennas and may consequently interfere with signals in the first transmission band that are transmitted through the first circuit. The interference may cause intermodulation distortion, and as a result, the reception sensitivity in the first frequency band may degrade.

As a workaround, the impedance variable circuit that causes, in the CA mode, reflection of signal components in the second transmission band is connected to the second transmission terminal of the first multiplexer. In the CA mode, some signal components in the second transmission band may flow from the second circuit and may enter the first circuit. However, this configuration enables more signal components in the second transmission band to be reflected off the first multiplexer. This enables a reduction in the amount of intermodulation distortion that would occur when signals in the first frequency band and signals in the second frequency band are simultaneously transmitted.

The impedance variable circuit may include a second switch, a reflection circuit, and a matching circuit. The second switch includes: a third common terminal connected to the second transmission terminal; a first selection terminal; and a second selection terminal. When the CA mode is selected, the third common terminal is electrically connected to the first selection terminal and is not electrically connected to the second selection terminal. The reflection circuit is connected to the first selection terminal. When the third common terminal is electrically connected to the first selection terminal, the reflection circuit causes reflection of signal components in the second transmission band that are transmitted from the first switch toward the third common terminal. The matching circuit is connected to the second selection terminal. When the third common terminal is electrically connected to the second selection terminal, the matching circuit transmits or absorbs signal components in the second transmission band.

In the CA mode, this configuration forms a connection between the reflection circuit and the first multiplexer via the second transmission terminal. With the second transmission terminal being viewed from the first common terminal side, the impedance involves as much reflection as would occur in the open state. Although some signal components in the second transmission band may flow from the second circuit and may enter the first circuit, this configuration enables more signal components in the second transmission band to be reflected off the first multiplexer. This enables a reduction in the amount of intermodulation distortion that would occur when signals in the first frequency band and signals in the second frequency band are simultaneously transmitted.

The front-end module may further include: a reception amplifier circuit and a fourth switch. The reception amplifier circuit includes an input terminal and an output terminal. With the input terminal being connected to the first reception terminal, the reception amplifier circuit amplifies reception signals in the first reception band. The fourth switch includes a fourth common terminal, a third selection terminal, and a fourth selection terminal. The fourth common terminal is connected to the output terminal. The matching circuit is a 50-ohm resistor connected to the second selection terminal. The first transmission terminal may be a transmission terminal for the first transmission band in the CA mode. The third selection terminal may be a reception terminal for the first reception band in the CA mode. The fourth selection terminal may be a reception terminal for the first reception band in a non-CA involving transmission and reception of signals in the first frequency band or transmission and reception of signals in the second frequency band. The second reception signal may be a reception terminal for the second reception band in the non-CA mode.

The front-end module configured as described above is thus applicable to the following system. In the non-CA mode, the second circuit serves as a main path, and the first circuit serves as a sub-path (a diversity path). In the CA mode (two uplinks), the second circuit serves as a transmission path for signals in the second frequency band, and the first circuit serves as a transmission path for signals in the first frequency band. In the CA mode, the second transmission terminal, which is 50-ohm terminated in the non-CA mode, may be efficiently used as a terminal for reflecting signals in the second frequency band.

The front-end module may further include a fifth switch that includes a fifth common terminal, a fifth selection terminal, and a sixth selection terminal. The fifth common terminal is connected to the second reception terminal. The reflection circuit may be a transmission amplifier circuit connected to the second selection terminal to amplify transmission signals in the second transmission band. The first transmission terminal may be a transmission terminal for the first transmission band in the CA mode and in a non-CA mode that involves transmission and reception of signals in the first frequency band or transmission and reception of signals in the second frequency band. The first reception terminal may be a reception terminal for the first reception band in the CA mode and in the non-CA mode. The fifth selection terminal may a reception terminal for the second reception band in the non-CA mode. The sixth selection terminal may be a reception terminal for the second reception band in the CA mode.

The front-end module configured as described above is thus applicable to the following system. In the non-CA mode, the first circuit serves as a main path, and the second circuit serves as a sub-path (a diversity path). In the CA mode (two uplinks), the first circuit serves as a transmission path for signals in the first frequency band, and the second circuit serves as a transmission path for signals in the second frequency band. In the CA mode, the second transmission terminal, which serves as a terminal for transmission signals in the second frequency band in the non-CA mode, may be efficiently used as a terminal for reflecting signals in the second frequency band.

The first circuit may further include: a third switch disposed between the first switch and the first multiplexer; and a first phase shifter disposed between the third switch and the first multiplexer to shift a phase of a signal component in the second transmission band.

When the third switch is disposed between the first switch and the first multiplexer to switch between each of the first and second frequency bands and another frequency band, the aforementioned intermodulation distortion caused by interference of two different transmission signals would also occur between the terminals of the third switch.

As a workaround, the first phase shifter is disposed between the third switch and the first multiplexer to shift the phase of each signal in the second transmission band. This configuration creates a phase difference between a second-transmission-band signal component flowing from the second circuit into the first circuit and a second-transmission-band signal component reflected off the first multiplexer and bouncing back to the third switch. Consequently, the two signals in the second transmission band cancel each other. The occurrence of intermodulation distortion in the third switch is suppressed accordingly.

The first circuit may further include a third switch disposed between the first switch and the first multiplexer. The reflection circuit may include a resistance element and a second phase shifter connected between the first selection terminal and the resistance element.

When the third switch is disposed between the first switch and the first multiplexer to switch between each of the first and second frequency bands and another frequency band, the aforementioned intermodulation distortion caused by interference of two different transmission signals would also occur between the terminals of the third switch.

As a workaround, the reflection circuit connected to the second transmission terminal via the second switch includes the second phase shifter. Through adjustment of phase shifts provided by the second phase shifter, this configuration enables optimization of the reflection coefficient for signals in the second transmission band at the second transmission terminal. Although some signals in the second transmission band may flow from the second circuit and may enter the first circuit, this configuration enables more signal components in the second transmission band to be reflected off the first multiplexer. The occurrence of intermodulation distortion in the first multiplexer is suppressed accordingly.

The second phase shifter creates a phase difference between a second-transmission-band signal flowing from the second circuit into the first circuit via the first switch and a second-transmission-band signal reflected off the first multiplexer and bouncing back to the third switch. Consequently, the two signals in the second transmission band cancel each other. The occurrence of intermodulation distortion in the third switch is suppressed accordingly.

The frequency at which intermodulation distortion occurs in the first multiplexer due to interference between a signal in the first transmission band and a signal in the second transmission band may be included in the first reception band.

In the CA mode, insufficiently attenuated transmission signals in the second transmission band may enter the first circuit through the first switch and the two or more antennas and may consequently interfere with transmission signals in the first transmission band that are transmitted through the first circuit. The interference may cause intermodulation distortion. When the first reception band includes the frequency at which the intermodulation distortion occurs, the intermodulation distortion components may pass through the first receiving filter, and as a result, the reception sensitivity in the first reception band may degrade.

Although some signals in the second transmission band may flow from the second circuit and may enter the first circuit via the first switch, this configuration enables more components in the second transmission band to be reflected off the first multiplexer. The occurrence of intermodulation distortion in the first multiplexer is suppressed accordingly. This mitigates degradation of reception sensitivity in the first reception band.

The front-end module may further include a first wave separator disposed between the first switch and the first multiplexer to separate signals into signals in the first frequency band group and signals in the second frequency band group different from the first frequency band group.

When a multi-band system capable of transmitting signals in different frequency band groups in a selective manner is operated in the CA mode to simultaneously transmit signals in two different frequency bands belonging to the same frequency band group, this configuration enables a reduction in the amount of intermodulation distortion caused by interference between a signal in one frequency band and a signal in the other frequency band.

The first frequency band may be long term evolution (LTE) Band 1 (the first transmission band: 1,920 to 1,980 MHz; the first reception band: 2,110 to 2,170 MHz). The second frequency band may be LTE Band 3 (the second transmission band: 1,710 to 1,785 MHz; the second reception band: 1,805 to 1,880 MHz). The frequency at which third-order intermodulation distortion occurs due to interference between a signal in the first transmission band and a signal in the second transmission band may be included in the first reception band.

In a system supporting the CA mode (two uplinks) for Band 1 and Band 3, the occurrence of third-order intermodulation distortion in the first multiplexer is suppressed accordingly. This mitigates degradation of reception sensitivity in Band 1.

According to another aspect of the present disclosure, a communication device includes: a radio-frequency signal processing circuit that processes radio-frequency signals transmitted or received via two or more antennas; and any one of the aforementioned front-end modules disposed between the radio-frequency signal processing circuit and each of the two or more antennas to transmit the radio-frequency signals.

Thus, a communication device that enables a reduction in the amount of intermodulation distortion associated with two different transmission signals and mitigates degradation of reception sensitivity is provided.

Other features, elements, characteristics, and advantages of the present disclosure will become more apparent from the following detailed description of embodiments of the present disclosure with reference to the attached drawings.

DETAILED DESCRIPTION

Hereinafter, embodiments of the present disclosure will be described in detail by citing examples with reference to the accompanying drawings. The following embodiments are general or specific examples. Details such as values, shapes, materials, constituent components, and arrangements and connection patterns of the constituent components in the following embodiments are provided merely as examples and should not be construed as limiting the present disclosure. Of the constituent components in the following embodiments, constituent components that are not mentioned in independent claims are described as optional constituent components. The sizes and the relative proportions of the constituent components illustrated in the drawings are not necessarily to scale.

Embodiments

1. Configuration of Front-End Module 1 in Example 1

Figure 1:
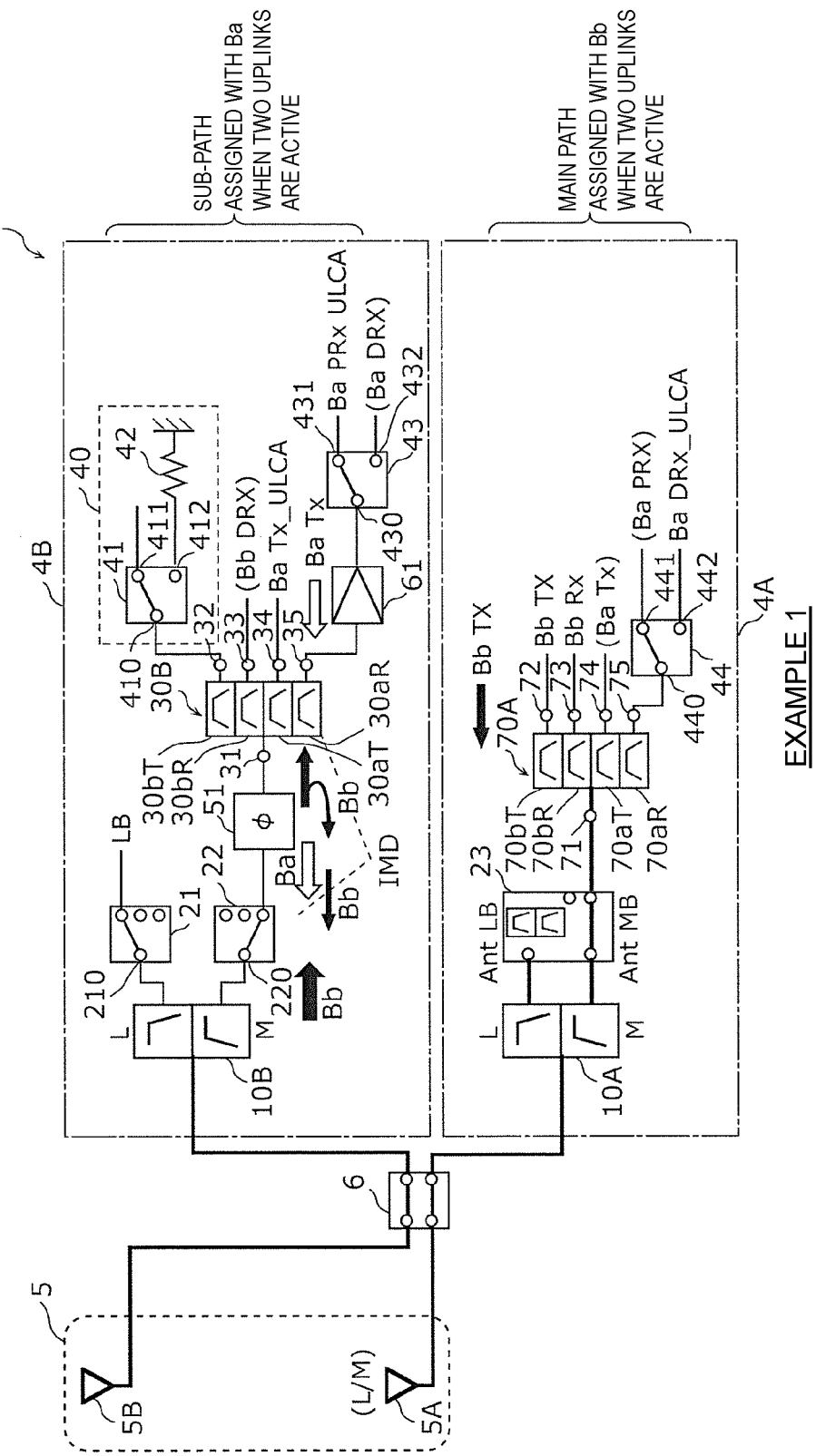
FIG. 1 is a circuit configuration diagram of a front-end module in Example 1.

FIG. 1 is a circuit configuration diagram of a front-end module 1 in Example 1. FIG. 1 illustrates the front-end module 1 and an antenna unit 5 in Example 1. The front-end module 1 illustrated in FIG. 1 includes front-end circuits 4A and 4B and a switch 6.

The antenna unit 5 includes a main antenna 5A and a sub-antenna 5B.

The switch 6 is a first switch disposed between the antenna unit 5 and each of the front-end circuits 4A and 4B to switch between connections formed between the antenna unit 5 and each of the front-end circuits 4A and 4B. The switch 6 in this example is a double-pole, double-throw (DPDT) switch. The switch 6 is thus capable of switching between the state in which the main antenna 5A is connected to the front-end circuit 4A and the state in which the main antenna 5A is connected to the front-end circuit 4B. The switch 6 is also capable of switching between the state in which the sub-antenna 5B is connected to the front-end circuit 4A and the state in which the sub-antenna 5B is connected to the front-end circuit 4B.

The front-end circuit 4B is a first circuit including a diplexer 10B, switches 21, 22, and 43, a phase shifter 51, a quadplexer 30B, an impedance variable circuit 40, and a reception amplifier circuit 61.

The front-end circuit 4A is a second circuit including a diplexer 10A, a switch module 23, a quadplexer 70A, and a switch 44.

The following describes constituent components of the front-end circuit 4B.

The diplexer 10B is a first wave separator including a common terminal, a low-band terminal, and a middle-band terminal. The common terminal is connected to the switch 6. The first wave separator separates signals into signals in a low-band group (a second frequency band group) and signals in a middle-band group (a first frequency band group).

The switch 21 is a single-pole, n-throw (SPnT) switch that includes a common terminal 210 and selection terminals. The common terminal 210 is connected to the low-band terminal of the diplexer 10B and each of the selection terminals is connected to the transmission path for a corresponding band in the low-band group. The transmission paths provided for the respective bands and connected to the selection terminals are not illustrated in FIG. 1.

The switch 22 is a third switch disposed between the switch 6 and the quadplexer 30B. The switch 22 is an SPnT switch that includes a common terminal 220, a selection terminal 221, and other selection terminals. The common terminal 220 is connected to the middle-band terminal of the diplexer 10B. The selection terminal 221 is connected to the path on which the quadplexer 30B is disposed. Each of the other selection terminals is connected to the transmission path for a corresponding band in the middle-band group. Some of the transmission paths provided for the respective bands and connected to the corresponding selection terminals are not illustrated in FIG. 1.

The quadplexer 30B is a first multiplexer including transmitting filters 30aT and 30bT and receiving filters 30aR and 30bR.

The transmitting filter 30bT is a second transmitting filter connected to a common terminal 31 (a first common terminal) and to a transmission terminal 32 (a second transmission terminal). The pass band of the second transmitting filter is the transmission band of a band Bb (a second transmission band).

The receiving filter 30bR is a second receiving filter connected to the common terminal 31 and to a reception terminal 33 (a second reception terminal). The pass band of the second receiving filter is the reception band of the band Bb (a second reception band).

The transmitting filter 30aT is a first transmitting filter connected to the common terminal 31 and to a transmission terminal 34 (a first transmission terminal). The pass band of the first transmitting filter is the transmission band of a band Ba (a first transmission band).

The receiving filter 30aR is a first receiving filter connected to the common terminal 31 and to a reception terminal 35 (a first reception terminal). The pass band of the first receiving filter is the reception band of the band Ba (a first reception band).

The reception amplifier circuit 61 includes an input terminal and an output terminal. With the input terminal being connected to the reception terminal 35, the reception amplifier circuit 61 amplifies reception signals in the reception band of the band Ba.

The switch 43 is a fourth switch including a common terminal 430 (a fourth common terminal), a selection terminal 431 (a third selection terminal), and a selection terminal 432 (a fourth selection terminal). The common terminal 430 is connected to the output terminal of the reception amplifier circuit 61.

The phase shifter 51 is a first phase shifter disposed between the switch 22 and the quadplexer 30B to shift the phase of each signal in the transmission band of the band Bb.

The impedance variable circuit 40 includes a switch 41 connected to the transmission terminal 32, a reflection circuit, and a matching circuit. The switch 41 is a second switch including: a common terminal 410 (a third common terminal) connected to the transmission terminal 32; a selection terminal 411 (a first selection terminal); and a selection terminal 412 (a second selection terminal). When the CA mode is selected, the second switch is set to the state in which the common terminal 410 is electrically connected to the selection terminal 411 and is not electrically connected to the selection terminal 412.

In the CA mode, the impedance variable circuit 40 configured as described above can reflect signal components in the band Bb that are transmitted from the switch 6 toward the common terminal 410.

The CA mode referred to in the present embodiment involves, in addition to simultaneous reception of signals in two frequency bands, simultaneous transmission of signals in two frequency bands.

Although the reflection circuit is connected to the selection terminal 411, the reflection circuit in Example 1 is regarded as an open circuit with nothing connected to the selection terminal 411. Thus, the reflection circuit functions in such a manner that signals in the transmission band of the band Bb that are transmitted through the front-end circuit 4B from the diplexer 10B toward the common terminal 410 are reflected off the common terminal 31 when the common terminal 410 is electrically connected to the selection terminal 411.

The matching circuit includes a resistance element 42 for 50-ohm termination. The resistance element 42 is connected to the selection terminal 412. Thus, the matching circuit functions in such a way as to transmit or absorb signals in the transmission band of the band Bb when the common terminal 410 is electrically connected to the selection terminal 412.

The following describes constituent components of the front-end circuit 4A.

The diplexer 10A is a wave separator including a common terminal, a low-band terminal, and a middle-band terminal. The common terminal is connected to the switch 6. The wave separator separates signals into signals in the low-band group (the second frequency band group) and signals in the middle-band group (the first frequency band group).

The switch module 23 is a double-pole, n-throw (DPnT) switch module including two common terminals and a plurality of selection terminals. One of the two common terminals is connected to the low-band terminal of the diplexer 10A, and the other common terminal is connected to the middle-band terminal of the diplexer 10A. The one common terminal is connected to a duplexer that is included in the switch module 23 and provided for bands in the low-band group. Each of the selection terminal is connected to the transmission path for a corresponding band in the middle-band group. Some of the transmission paths provided for the respective bands and connected to the corresponding selection terminals are not illustrated in FIG. 1.

The quadplexer 70A is a second multiplexer including transmitting filters 70aT and 70bT and receiving filters 70aR and 70bR.

The transmitting filter 70bT is a fourth transmitting filter connected to a common terminal 71 (a second common terminal) and to a transmission terminal 72 (a fourth transmission terminal). The pass band of the fourth transmitting filter is the transmission band of the band Bb.

The receiving filter 70bR is a fourth receiving filter connected to the common terminal 71 and to a reception terminal 73 (a fourth reception terminal). The pass band of the fourth receiving filter is the reception band of the band Bb.

The transmitting filter 70aT is a third transmitting filter connected to the common terminal 71 and to a transmission terminal 74 (a third transmission terminal). The pass band of the third transmitting filter is the transmission band of the band Ba.

The receiving filter 70aR is a third receiving filter connected to the common terminal 71 and to a reception terminal 75 (a third reception terminal) The pass band of the third receiving filter is the reception band of the band Ba.

The switch 44 includes a common terminal 440 and selection terminals 441 and 442. The common terminal 440 is connected to the reception terminal 75.

The front-end module 1 in Example 1 has a configuration applicable to both the carrier aggregation (CA) mode involving simultaneous transmission and simultaneous reception of radio-frequency signals in two or more (frequency) bands and a non-CA mode involving transmission and reception of radio-frequency signals in one band alone.

Specifically, the front-end module 1 in Example 1 is configured to support the CA mode (two uplinks) involving simultaneous transmission of signals in a first frequency band and signals in a second frequency band. The first and second frequency bands are different frequency bands belonging to the first frequency band group including two or more frequency bands. In Example 1, the middle-band group is the first frequency band group, the band Ba is the first frequency band belonging to the middle-band group, and the band Bb is the second frequency band belonging to the middle-band group.

When the front-end module 1 is operated in the non-CA mode, the front-end circuit 4A serves as a main path for both transmission and reception of signals in the band Ba and transmission and reception of signals in the band Bb, and the front-end circuit 4B serves as a sub-path (e.g., a diversity circuit) for both transmission and reception of signals in the band Ba and transmission and reception of signals in the band Bb.

For transmission and reception of signals in the band Ba in the non-CA mode, the transmission terminal 74 of the front-end circuit 4A serves as a transmission terminal (Ba Tx) for the band Ba, and the selection terminal 441 connected to the common terminal 440 of the switch 44 serves as a reception terminal (Ba PRx) for the band Ba. The selection terminal 432 connected to the common terminal 430 of the switch 43 of the front-end circuit 4B serves as a diversity reception terminal (Ba DRx) for the band Ba.

For transmission and reception of signals in the band Bb in the non-CA mode, the transmission terminal 72 of the front-end circuit 4A serves as a transmission terminal (Bb Tx) for the band Bb, and the reception terminal 73 of the front-end circuit 4A serves as a reception terminal (Bb Rx) for the band Bb. The reception terminal 33 of the front-end circuit 4B serves as a diversity reception terminal (Bb DRx) for the band Bb, and the selection terminal 412 of the switch 41 serves as a terminal for 50-ohm termination for transmission signals in the band Bb.

When the front-end module 1 is operated in the CA mode (two uplinks) for the bands Ba and Bb, the front-end circuit 4B serves as a main path for transmission and reception of signals in the band Ba, and the front-end circuit 4A serves as a main path for transmission and reception of signals in the band Bb. Thus, the front-end circuit 4B selectively transmits signals in the band Ba and the front-end circuit 4A selectively transmits signals in the band Bb. In this case, the transmission terminal 72 of the front-end circuit 4A serves as a transmission terminal (Bb Tx) for the band Bb, and the reception terminal 73 of the front-end circuit 4A serves as a reception terminal (Bb Rx) for the band Bb. The transmission terminal 34 of the front-end circuit 4B serves as a transmission terminal (Ba Tx ULCA) for the band Ba, and the selection terminal 431 connected to the common terminal 430 of the switch 43 serves as a reception terminal (Ba PRx ULCA) for the band Ba. The selection terminal 442 connected to the common terminal 440 of the switch 44 of the front-end circuit 4A serves as a diversity reception terminal (Ba DRx ULCA) for the band Ba. The reception terminal 33 of the front-end circuit 4B serves as a diversity reception terminal (Bb DRx) for the band Bb.

As described above, all of the transmission terminals and the reception terminals of the quadplexer 70A and all of the transmission terminals and the reception terminals of the quadplexer 30B are used when both the CA mode (two uplinks) and the non-CA mode are supported. It is thus required that each of the front-end circuits 4A and 4B includes a quadplexer for the bands Ba and Bb, which are to be subjected to CA.

The distinctive features of the front-end module 1 in Example 1 include the impedance variable circuit 40 and the phase shifter 51.

Actions and effects caused by the impedance variable circuit 40 and the phase shifter 51 will be described based on the following description of the configuration of a front-end module 500 in Comparative Example and problems associated with the front-end module 500.

2. Configuration of Front-End Module 500 in Comparative Example

Figure 2:
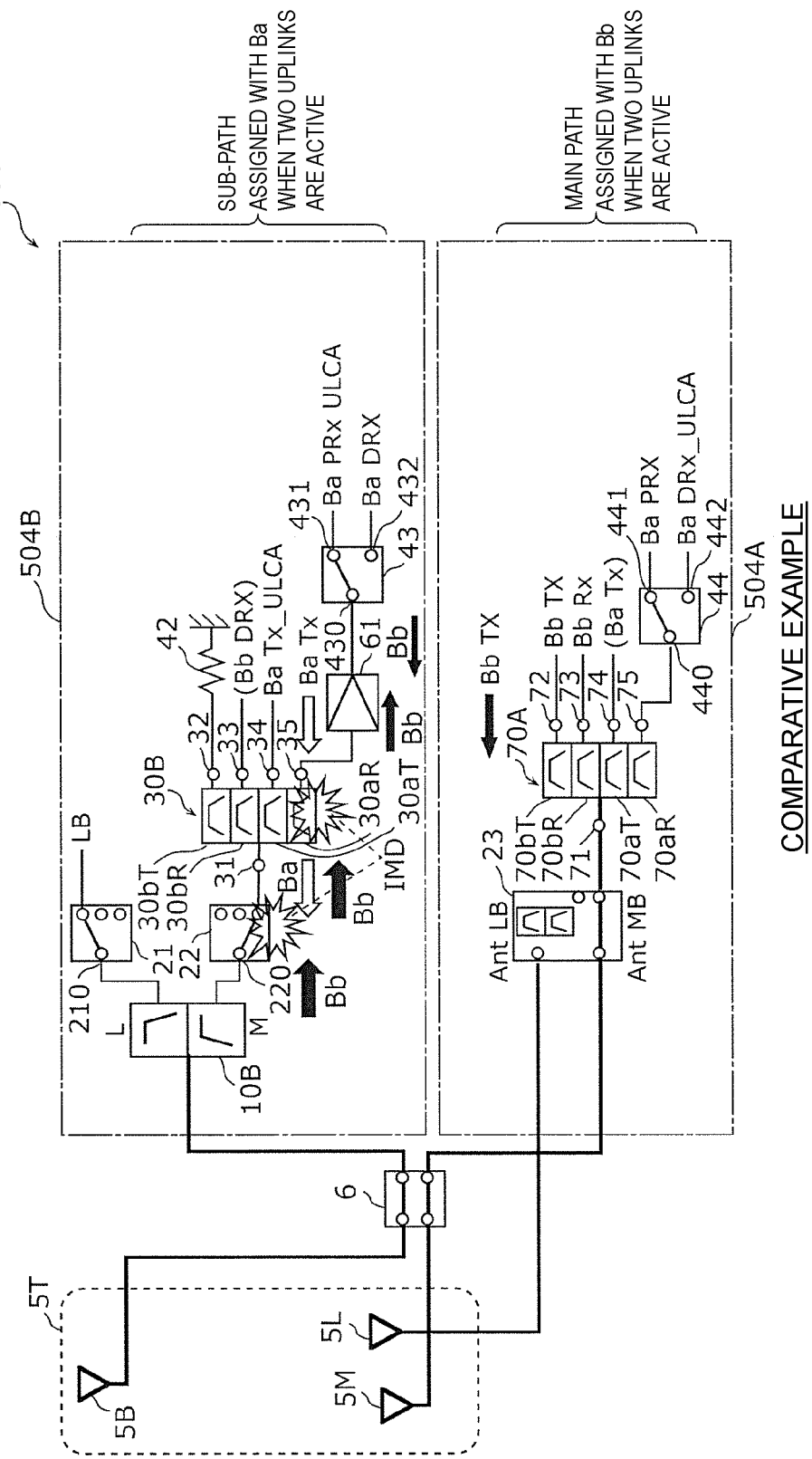
FIG. 2 is a circuit configuration diagram of a front-end module in Comparative Example.

FIG. 2 is a circuit configuration diagram of the front-end module 500 of Comparative Example. FIG. 2 illustrates the front-end module 500 and an antenna unit 5T in Comparative Example. The front-end module 500 illustrated in FIG. 2 includes front-end circuits 504A and 504B and the switch 6.

The antenna unit 5T includes main antennas 5M and 5L and the sub-antenna 5B.

The difference between the front-end module 500 illustrated in FIG. 2 and the front-end module 1 in Example 1 is in the configuration of the impedance variable circuit. The front-end module 500 also differs from the front-end module 1 in that no phase shifter is disposed in the front-end circuit 504B and that no diplexer is disposed in the front-end circuit 504A. Configurations common to the front-end module 500 in Comparative Example and the front-end module 1 in Example 1 will be omitted from the following description, which will be given while focusing on distinctive features of the front-end module 500.

The switch 6 is capable of switching between the state in which the main antenna 5M is connected to the front-end circuit 504A and the state in which the main antenna 5M is connected to the front-end circuit 504B. The switch 6 is also capable of switching between the state in which the sub-antenna 5B is connected to the front-end circuit 504A and the state in which the sub-antenna 5B is connected to the front-end circuit 504B.

The front-end circuit 504B includes the diplexer 10B, the switches 21, 22, and 43, the quadplexer 30B, the resistance element 42, and the reception amplifier circuit 61.

The front-end circuit 504A includes the switch module 23, the quadplexer 70A, and the switch 44.

The resistance element 42 is a resistance element for 50-ohm termination and is connected to the transmission terminal 32.

The selection terminal 221 of the switch 22 is connected to the common terminal 31 of the quadplexer 30B.

The switch module 23 is a double-pole, n-throw (DPnT) switch module including two common terminals and a plurality of selection terminals. One of the two common terminals is connected to the main antenna 5L for a low band, and the other common terminal is connected to the switch 6. The one common terminal is connected to a duplexer that is included in the switch module 23 and provided for bands in the low-band group. One of the selection terminals is connected to the quadplexer 70A for the bands Ba and Bb in the middle-band group. Each of the other selection terminals is connected to a duplexer for a corresponding band in the middle-band group other than the bands Ba and Bb.

In the CA mode (two uplinks) involving simultaneous transmission of transmission signals in two bands, namely, the bands Ba and Bb belonging to the same frequency band group (the middle-band group), it is required that transmission signals and reception signals in the band Ba are transmitted through one signal path and transmission signals and reception signals in the band Bb are transmitted through another signal path. For example, transmission signals and reception signals in the band Ba are transmitted through the front-end circuit 504B, and transmission signals and reception signals in the band Bb are transmitted through the front-end circuit 504A. Isolation between a transmission signal in the band Ba and a transmission signal in the band Bb may be provided solely by the antenna unit 5T and the switch 6. It is difficult to provide additional isolation through, for example, the switch module 23 and the diplexer 10B used to separate signals into signals in one frequency band group and signals in another frequency band group. Thus, insufficiently attenuated transmission signals in the band Bb may enter the front-end circuit 504B and may consequently interfere with transmission signals in the band Ba that are transmitted through the front-end circuit 504B. The interference may cause intermodulation distortion, and as a result, the reception sensitivity in the frequency band including the frequency at which the intermodulation distortion occurs may degrade.

Assume that the band Ba is long term evolution (LTE) Band 1 (the first transmission band: 1,920 to 1,980 MHz; the first reception band: 2,110 to 2,170 MHz) and the band Bb is LTE Band 3 (the second transmission band: 1,710 to 1,785 MHz; the second reception band: 1,805 to 1,880 MHz). With Band 1 and Band 3 belonging to the same frequency band group (the middle-band group), the reception band of Band 1 in this example case includes the frequency at which third-order intermodulation distortion occurs due to interference between a transmission signal in Band 1 and a transmission signal in Band 3. Due to the occurrence of third-order intermodulation distortion, the reception sensitivity associated with reception signals output to the selection terminal 431 of the switch 43 may degrade.

3. Actions and Effects Caused by Front-End Module 1 in Example 1

Unlike the front-end module 500 of the Comparative Example described above, the front-end module 1 in Example 1 is configured to form a connection between the reflection circuit and the quadplexer 30B via the transmission terminal 32 in the CA mode (two uplinks) for the bands Ba and Bb. With the transmission terminal 32 being viewed from the diplexer 10B side, the impedance state involves a large amount of reflection. Some transmission signal components in the band Bb may flow from the front-end circuit 4A and may enter the front-end circuit 4B through the antenna unit 5 and the switch 6. However, the aforementioned configuration enables more radio frequency components in the band Bb to be reflected off the quadplexer 30B. This enables a reduction in the amount of intermodulation distortion that would occur in the quadplexer 30B when signals in the band Ba and signals in the band Bb are simultaneously transmitted.

Figure 3A:
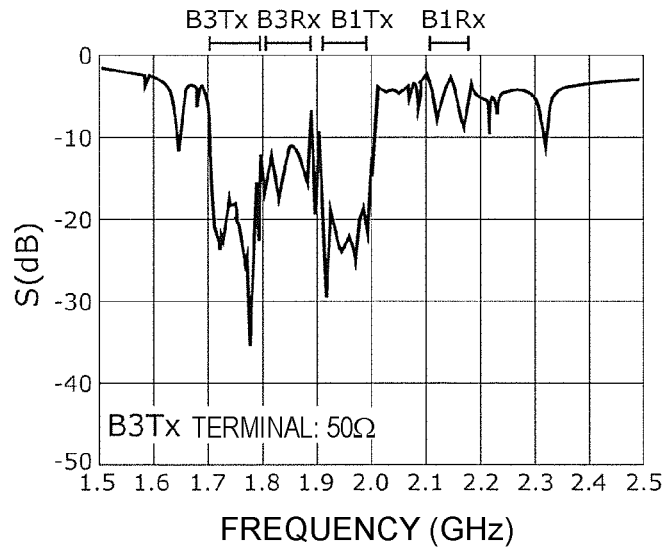
FIG. 3A is a graph illustrating reflection characteristics, with a transmission terminal included in a quadplexer in Example 1 and corresponding to Band 3 being 50-ohm terminated.
Figure 3B:
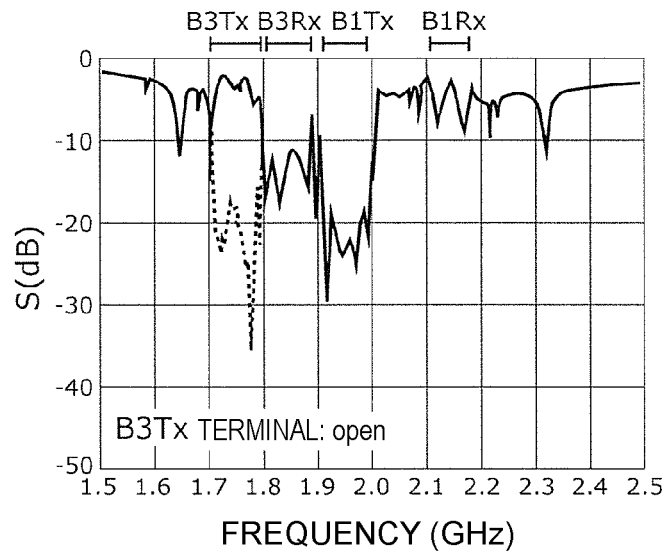
FIG. 3B is a graph illustrating reflection characteristics, with the transmission terminal included in the quadplexer in Example 1 and corresponding to Band 3 being open-ended.

FIG. 3A is a graph illustrating reflection characteristics that were exhibited when the transmission terminal 32 included in the quadplexer 30B in Example 1 and corresponding to Band 3 was 50-ohm terminated. FIG. 3B is a graph illustrating reflection characteristics that were exhibited when the transmission terminal 32 included in the quadplexer 30B in Example 1 and corresponding to Band 3 was open-ended.

More specifically, FIG. 3A illustrates reflection characteristics that were exhibited through a simulation conducted on the front-end module 1 in Example 1 when the common terminal 410 and the selection terminal 412 of the switch 41 were electrically connected to each other. The reflection characteristics were exhibited, with the quadplexer 30B being viewed from the common terminal 31. FIG. 3B illustrates reflection characteristics that were exhibited through a simulation conducted on the front-end module 1 in Example 1 when the common terminal 410 and the selection terminal 411 of the switch 41 were electrically connected to each other. The reflection characteristics were determined, with the quadplexer 30B being viewed from the common terminal 31.

Referring to FIGS. 3A and 3B, LTE Band 1 was used as the band Ba, and LTE Band 3 was used as the band Bb.

As illustrated in FIG. 3A, the return loss in the transmission band (B3Tx) of Band 3 is sufficiently high (more negative) when the matching circuit is selected through the switch 41 in the impedance variable circuit 40 of the front-end module 1 in Example 1. This indicates that transmission signals in Band 3 flow through the quadplexer 30B from the common terminal 31 toward the selection terminal 411 and are absorbed.

As illustrated in FIG. 3B, the return loss obtained in the transmission band (B3Tx) of Band 3 when the reflection circuit is selected through the switch 41 in the impedance variable circuit 40 of the front-end module 1 in Example 1 is less sufficient (less negative) than the return loss obtained when the matching circuit is selected through the switch 41. This indicates that more transmission signal components in Band 3 are reflected without necessarily flowing into the quadplexer 30B through the common terminal 31.

The quadplexer 30B includes a nonlinear element, which gives rise to occurrence of intermodulation distortion in the quadplexer 30B. As a workaround, the front-end module 1 in Example 1 may be operated in the CA mode in the state in which the reflection circuit in the impedance variable circuit 40 is selected. This enables a reduction in transmission signal components in Band 3 that flow into the quadplexer 30B, and the occurrence of intermodulation distortion in the quadplexer 30B is suppressed accordingly. This configuration eliminates or reduces, for example, the possibility that the reception sensitivity in Band 1 (the band Ba) will degrade due to the occurrence of third-order intermodulation distortion.

The front-end module 1 in Example 1 is also characterized in that the phase shifter 51 is disposed between the switch 22 and the quadplexer 30B. Intermodulation distortion between a signal in Band 1 (the band Ba) and a signal in Band 3 (the band Bb) would occur not only in the quadplexer 30B but also in the switch 22.

In the CA mode, the impedance variable circuit 40 causes, as described above, reflection of waves in Band 3 (the band Bb), which in turn flow from the common terminal 31 of the quadplexer 30B toward the switch 22. The phase shifter 51 enables the reflected waves to cancel transmission waves in Band 3 that flow into the front-end circuit 4B through the switch 6. More specifically, the phase shifter 51 performs phase adjustment to create a phase difference between a transmission wave in Band 3 and a reflected wave (ideally, the phase shifter 51 shifts these signals into opposite phases). This enables a reduction in the transmission waves in Band 3 that flow into the switch 22. The occurrence of intermodulation distortion in the switch 22 is suppressed accordingly. This configuration eliminates or reduces, for example, the possibility that the reception sensitivity in Band 1 will degrade due to the occurrence of third-order intermodulation distortion.

4. Configuration of Front-End Module 2 in Example 2

Figure 4:
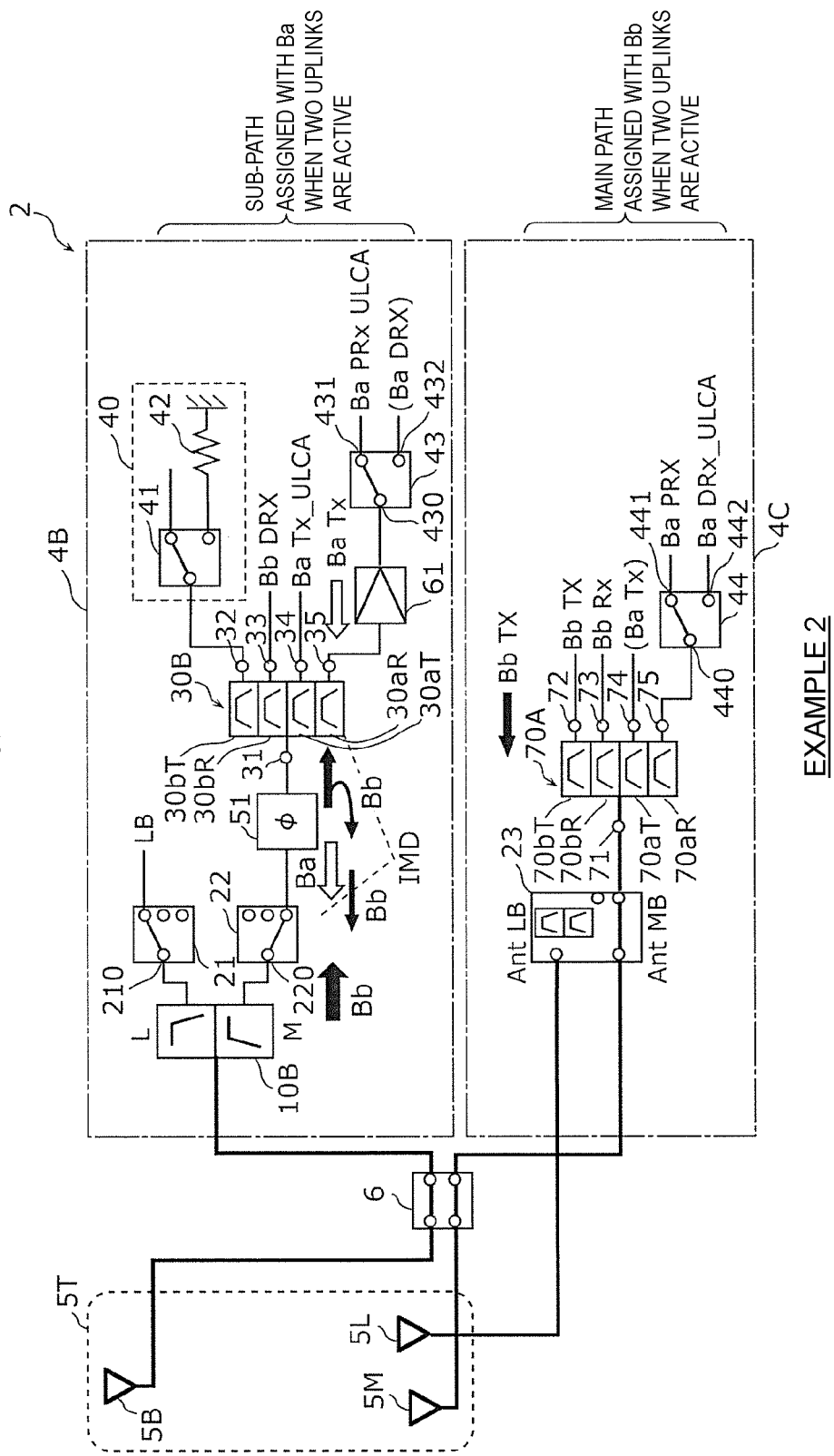
FIG. 4 is a circuit configuration diagram of a front-end module in Example 2.

FIG. 4 is a circuit configuration diagram of a front-end module 2 in Example 2. FIG. 4 illustrates the front-end module 2 and the antenna unit 5T in Example 2. The front-end module 2 illustrated in FIG. 4 includes a front-end circuit 4C, the front-end circuit 4B, and the switch 6.

The antenna unit 5T includes the main antennas 5M and 5L and the sub-antenna 5B.

The front-end module 2 illustrated in FIG. 4 differs from the front-end module 1 in Example 1 in that no diplexer is disposed in the front-end circuit 4C. Configurations common to the front-end module 2 in Example 2 and the front-end module 1 in Example 1 will be omitted from the following description, which will be given while focusing on distinctive features of the front-end module 2.

The switch 6 is capable of switching between the state in which the main antenna 5M is connected to the front-end circuit 4C and the state in which the main antenna 5M is connected to the front-end circuit 4B. The switch 6 is also capable of switching between the state in which the sub-antenna 5B is connected to the front-end circuit 4B and the state in which the sub-antenna 5B is connected to the front-end circuit 4C.

The front-end circuit 4C includes the switch module 23, the quadplexer 70A, and the switch 44.

The switch module 23 is a double-pole, n-throw (DPnT) switch module including two common terminals and a plurality of selection terminals. One of the two common terminals is connected to the main antenna 5L for a low band, and the other common terminal is connected to the switch 6. The one common terminal is connected to a duplexer that is included in the switch module 23 and provided for bands in the low-band group. One of the selection terminals is connected to the quadplexer 70A for the bands Ba and Bb in the middle-band group. Each of the other selection terminals is connected to a duplexer for a corresponding band in the middle-band group other than the bands Ba and Bb.

In Example 2, signals in the low-band group and signals in the middle-band group are not transmitted and received through the same main antenna. Instead, signals in the low-band group are transmitted and received through the main antenna 5L for the low band, and signals in the middle-band group are transmitted and received through the main antenna 5M for the middle band.

This configuration suppresses, for example, interference between signals in different frequency band groups.

The front-end module 2 in Example 2 may be operated in the CA mode in the state in which the reflection circuit in the impedance variable circuit 40 is selected. This suppresses the occurrence of intermodulation distortion in the quadplexer 30B. Furthermore, the phase shifter 51 performs phase adjustment to create a phase difference between a transmission wave in the band Bb and a reflected wave in the band Bb. This enables a reduction in transmission waves in the band Bb that flow into the switch 22. The occurrence of intermodulation distortion in the switch 22 is suppressed accordingly. This configuration eliminates or reduces the possibility that the reception sensitivity in the band Ba will degrade due to the occurrence of intermodulation distortion.

5. Configuration of Front-End Module 3 in Example 3

Unlike the front-end module 1 in Example 1 configured to suppress the occurrence of intermodulation distortion in the sub-path, a front-end module 3 in Example 3 is configured to suppress the occurrence of intermodulation distortion in the main path as will be described below.

Figure 5:
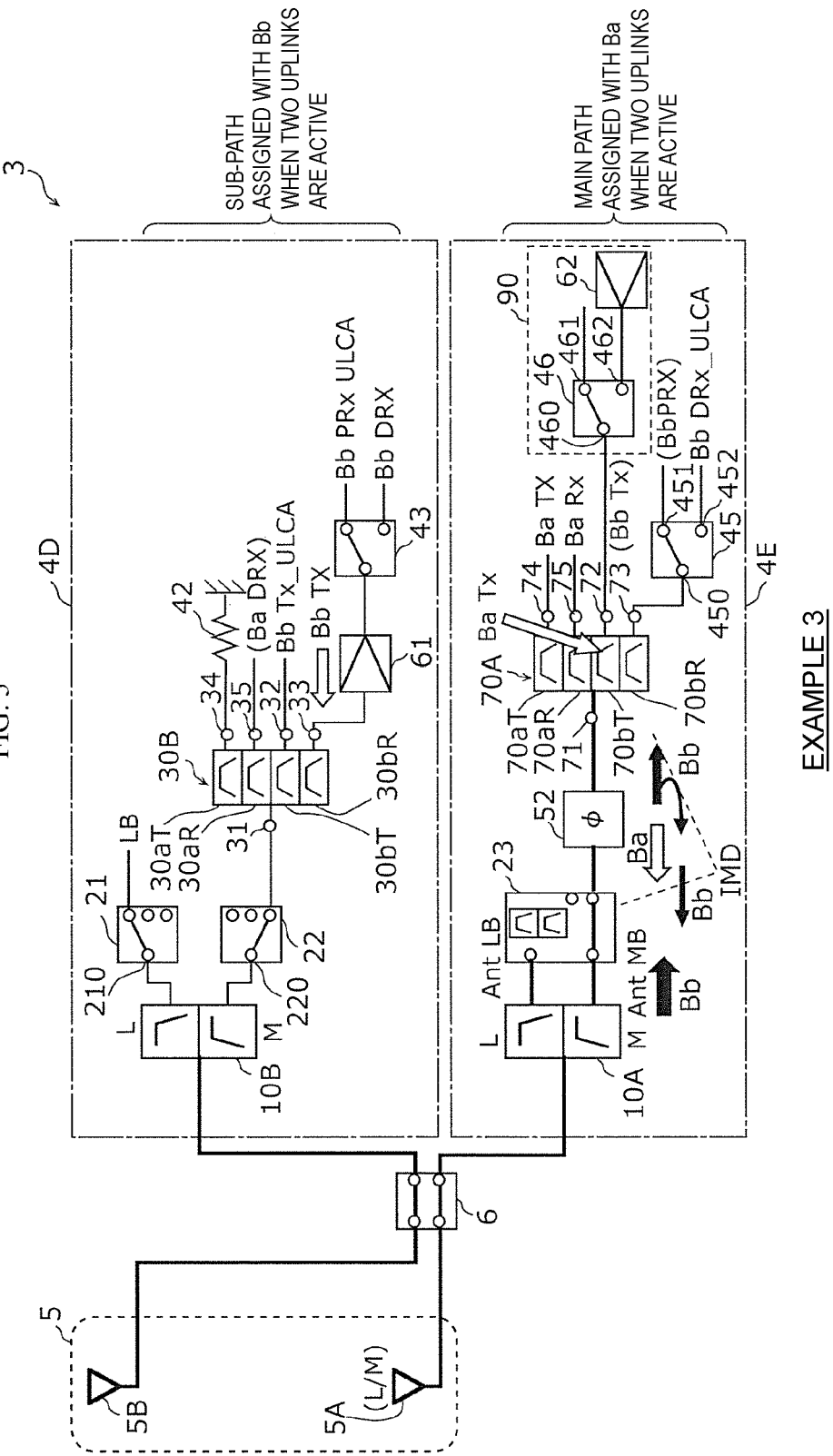
FIG. 5 is a circuit configuration diagram of a front-end module in Example 3.

FIG. 5 is a circuit configuration diagram of the front-end module 3 in Example 3. FIG. 3 illustrates the front-end module 3 and the antenna unit 5 in Example 1. The front-end module 3 illustrated in FIG. 5 includes a front-end circuit 4D, a front-end circuit 4E, and the switch 6. The following description will be given while focusing on features of the front-end module 3 in Example 3 that are different from the features of the front-end module 1 in Example 1.

The switch 6 is a first switch disposed between the antenna unit 5 and each of the front-end circuits 4D and 4E to switch between connections formed between the antenna unit 5 and each of the front-end circuits 4D and 4E.

The front-end circuit 4E is a first circuit including the diplexer 10A, the switch module 23, a phase shifter 52, the quadplexer 70A, an impedance variable circuit 90, and a switch 45.

The front-end circuit 4D is a second circuit including the diplexer 10B, the switches 21, 22, and 43, the quadplexer 30B, and the resistance element 42.

The following describes constituent components of the front-end circuit 4E.

The diplexer 10A is a first wave separator including a common terminal, a low-band terminal, and a middle-band terminal. The common terminal is connected to the switch 6. The first wave separator separates signals into signals in the low-band group (the second frequency band group) and signals in the middle-band group (the first frequency band group).

The switch module 23 is a third switch, which is a double-pole, n-throw (DPnT) switch including two common terminals and a plurality of selection terminals. One of the two common terminals is connected to the low-band terminal of the diplexer 10A, and the other common terminal is connected to the middle-band terminal of the diplexer 10A. The one common terminal is connected to a duplexer that is included in the switch module 23 and provided for bands in the low-band group. One of the selection terminals is connected to the quadplexer 70A for the bands Ba and Bb in the middle-band group via the phase shifter 52. Each of the other selection terminals is connected to a duplexer for a corresponding band in the middle-band group other than the bands Ba and Bb.

The quadplexer 70A is a first multiplexer including the transmitting filters 70aT and 70bT and the receiving filters 70aR and 70bR.

The transmitting filter 70aT is a first transmitting filter connected to the common terminal 71 (a first common terminal) and to the transmission terminal 74 (a first transmission terminal). The pass band of the first transmitting filter is the transmission band of the band Ba (a first transmission band).

The receiving filter 70aR is a first receiving filter connected to the common terminal 71 and to the reception terminal 75 (a first reception terminal). The pass band of the first receiving filter is the reception band of the band Ba (a first reception band).

The transmitting filter 70bT is a second transmitting filter connected to the common terminal 71 and to the transmission terminal 72 (a second transmission terminal). The pass band of the second transmitting filter is the transmission band of the band Bb (a second transmission band).

The receiving filter 70bR is a second receiving filter connected to the common terminal 71 and to the reception terminal 73 (a second reception terminal). The pass band of the second receiving filter is the reception band of the band Bb (a second reception band).

The switch 45 is a fifth switch including a common terminal 450 (a fifth common terminal); a selection terminal 451 (a fifth selection terminal), and a selection terminal 452 (a sixth selection terminal). The common terminal 450 is connected to the reception terminal 73.

The phase shifter 52 is a first phase shifter disposed between the switch module 23 and the quadplexer 70A to shift the phase of each signal in the transmission band of the band Bb.

The impedance variable circuit 90 includes a switch 46 connected to the transmission terminal 72, a reflection circuit, and a matching circuit. The switch 46 is a second switch including: a common terminal 460 (a third common terminal) connected to the transmission terminal 72; a selection terminal 461 (a first selection terminal); and a selection terminal 462 (a second selection terminal). When the CA mode is selected, the second switch is set to the state in which the common terminal 460 is electrically connected to the selection terminal 461 and is not electrically connected to the selection terminal 462.

In the CA mode, the impedance variable circuit 90 configured as described above can reflect signal components in the band Bb that are transmitted from the switch 6 toward the common terminal 460.

Although the reflection circuit is connected to the selection terminal 461, the reflection circuit in Example 3 is regarded as an open circuit with nothing connected to the selection terminal 461. Thus, the reflection circuit functions in such a manner that signals in the transmission band of the band Bb that are transmitted through the front-end circuit 4E from the diplexer 10A toward the common terminal 460 are reflected when the common terminal 460 is electrically connected to the selection terminal 461.

The matching circuit includes a transmission amplifier circuit 62 connected to the selection terminal 462. Thus, the matching circuit functions in such a way as to transmit or absorb signals in the transmission band of the band Bb when the common terminal 460 is electrically connected to the selection terminal 462. In the non-CA mode, the transmission amplifier circuit 62 amplifies reception signals in the transmission band of the band Bb. In the CA mode, however, the transmission amplifier circuit 62 does not perform amplification.

The following describes constituent components of the front-end circuit 4D.

The diplexer 10B is a wave separator including a common terminal, a low-band terminal, and a middle-band terminal. The common terminal is connected to the switch 6. The wave separator separates signals into signals in the low-band group (the second frequency band group) and signals in the middle-band group (the first frequency band group).

The switch 21 is an SPnT switch that includes the common terminal 210 and selection terminals. The common terminal 210 is connected to the low-band terminal of the diplexer 10B and each of the selection terminals is connected to the transmission path for a corresponding band in the low-band group.

The switch 22 is disposed between the switch 6 and the quadplexer 30B. The switch 22 is an SPnT switch that includes the common terminal 220, the selection terminal 221, and other selection terminals. The common terminal 220 is connected to the middle-band terminal of the diplexer 10B. The selection terminal 221 is connected to the path on which the quadplexer 30B is disposed. Each of the other selection terminals is connected to the duplexer for a corresponding band in the middle-band group.

The quadplexer 30B is a second multiplexer including the transmitting filters 30aT and 30bT and the receiving filters 30aR and 30bR.

The transmitting filter 30aT is a third transmitting filter connected to the common terminal 31 (a second common terminal) and to the transmission terminal 34 (a third transmission terminal). The pass band of the third transmitting filter is the transmission band of the band Ba.

The receiving filter 30aR is a third receiving filter connected to the common terminal 31 and to the reception terminal 35 (a third reception terminal). The pass band of the third receiving filter is the reception band of the band Ba.

The transmitting filter 30bT is a fourth transmitting filter connected to the common terminal 31 and to the transmission terminal 32 (a fourth transmission terminal). The pass band of the fourth transmitting filter is the transmission band of the band Bb.

The receiving filter 30bR is a fourth receiving filter connected to the common terminal 31 and to the reception terminal 33 (a fourth reception terminal). The pass band of the fourth receiving filter is the reception band of the band Bb.

The resistance element 42 is a resistance element for 50-ohm termination and is connected to the transmission terminal 34.

The reception amplifier circuit 61 includes an input terminal and an output terminal. The input terminal is connected to the reception terminal 33. The reception amplifier circuit 61 amplifies reception signals in the reception band of the band Bb.

The switch 43 includes the common terminal 430 and the selection terminals 431 and 432. The common terminal 430 is connected to the output terminal of the reception amplifier circuit 61.

The front-end module 3 in Example 3 has a configuration applicable to both the CA involving simultaneous transmission and simultaneous reception of radio-frequency signals in two or more (frequency) bands and a non-CA mode for transmission and reception of radio-frequency signals in one band alone.

Specifically, the front-end module 3 in Example 3 is configured to support the CA mode (two uplinks) involving simultaneous transmission of signals in the first transmission band and signals in the second transmission band. The first and second frequency bands are different frequency bands belonging to the first frequency band group including two or more frequency bands. In Example 3, the middle-band group is the first frequency band group, the band Ba is the first frequency band belonging to the middle-band group, and the band Bb is the second frequency band belonging to the middle-band group.

When the front-end module 3 is operated in the non-CA mode, the front-end circuit 4E serves as a main path for both transmission and reception of signals in the band Ba and transmission and reception of signals in the band Bb, and the front-end circuit 4D serves as a sub-path (e.g., a diversity circuit) for both transmission and reception of signals in the band Ba and transmission and reception of signals in the band Bb.

For transmission and reception of signals in the band Ba in the non-CA mode, the transmission terminal 74 of the front-end circuit 4E serves as a transmission terminal (Ba Tx) for the band Ba, and the reception terminal 75 of the front-end circuit 4E serves as a reception terminal (Ba Rx) for the band Ba. The transmission terminal 34 of the front-end circuit 4D serves as a terminal for 50-ohm termination for transmission signals in the band Ba, and the reception terminal 35 serves as a diversity reception terminal (Ba DRx) for the band Ba.

For transmission and reception of signals in the band Bb in the non-CA mode, the transmission terminal 72 of the front-end circuit 4E serves as a transmission terminal (Bb Tx) for the band Bb, and the selection terminal 451 connected to the common terminal 450 of the switch 45 serves as a reception terminal (Bb PRx) for the band Bb. The selection terminal 432 connected to the common terminal 430 of the switch 43 of the front-end circuit 4D serves as a diversity reception terminal (Bb DRx) for the band Bb.

When the front-end module 3 is operated in the CA mode (two uplinks) for the bands Ba and Bb, the front-end circuit 4E serves as a main path for transmission and reception of signals in the band Ba, and the front-end circuit 4D serves as a main path for transmission and reception of signals in the band Bb. Thus, the front-end circuit 4E selectively transmits signals in the band Ba and the front-end circuit 4D selectively transmits signals in the band Bb. In this case, the transmission terminal 32 of the front-end circuit 4D serves as a transmission terminal (Bb Tx ULCA) for the band Ba, and the selection terminal 431 connected to the common terminal 430 of the switch 43 serves as a reception terminal (Bb PRx ULCA) for the band Bb. The transmission terminal 74 of the front-end circuit 4E serves as a transmission terminal (Ba Tx) for the band Ba, and the reception terminal 75 of the front-end circuit 4E serves as a reception terminal (Ba Rx) for the band Ba. The selection terminal 452 connected to the common terminal 450 of the switch 45 of the front-end circuit 4E serves as a diversity reception terminal (Bb DRx ULCA) for the band Bb. The reception terminal 35 of the front-end circuit 4D serves as a diversity reception terminal (Ba DRx) for the band Ba.

As described above, all of the transmission terminals and the reception terminals of the quadplexer 70A and all of the transmission terminals and the reception terminals of the quadplexer 30B are used when both the CA mode (two uplinks) and the non-CA mode are supported. It is thus required that each of the front-end circuits 4D and 4E includes a quadplexer for the bands Ba and Bb, which are to be subjected to CA.

The distinctive features of the front-end module 3 in Example 3 include the impedance variable circuit 90 and the phase shifter 52.

The front-end module 3 in Example 3 is configured to form a connection between the reflection circuit and the quadplexer 70A via the transmission terminal 72 in the CA mode (two uplinks) for the bands Ba and Bb. With the transmission terminal 72 being viewed from the diplexer 10A side, the impedance state involves a large amount of reflection. Some transmission signal components in the band Bb may flow from the front-end circuit 4D and may enter the front-end circuit 4E through the antenna unit 5 and the switch 6. However, the aforementioned configuration enables more radio frequency components in the band Bb to be reflected off the quadplexer 70A. This enables a reduction in the amount of intermodulation distortion that would occur when signals in the band Ba and signals in the band Bb are simultaneously transmitted.

The quadplexer 70A includes a nonlinear element, which gives rise to occurrence of intermodulation distortion in the quadplexer 70A. The front-end module 3 in Example 3 may be operated in the CA mode in the state in which the reflection circuit in the impedance variable circuit 90 is selected. This suppresses the occurrence of intermodulation distortion in the quadplexer 70A. This configuration eliminates or reduces, for example, the possibility that the reception sensitivity in the band Ba will degrade due to the occurrence of third-order intermodulation distortion.

The front-end module 3 in Example 3 is also characterized in that the phase shifter 52 is disposed between the switch module 23 and the quadplexer 70A. Intermodulation distortion between a signal in the band Ba and a signal in the band Bb would occur not only in the quadplexer 70A but also in the switch module 23.

In the CA mode, the impedance variable circuit 90 causes, as described above, reflection of waves in the band Bb, which in turn flow from the common terminal 71 of the quadplexer 70A toward the switch module 23. The phase shifter 52 enables the reflected waves to cancel transmission waves in the band Bb that flow into the front-end circuit 4E through the switch 6. More specifically, the phase shifter 52 performs phase adjustment to create a phase difference between a transmission wave in the band Bb and a reflected wave (ideally, the phase shifter 52 shifts these signals into opposite phases). This enables a reduction in transmission waves in the band Bb that flow into the switch module 23. The occurrence of intermodulation distortion in the switch module 23 is suppressed accordingly. This configuration eliminates or reduces the possibility that the reception sensitivity in the band Ba will degrade due to the occurrence of intermodulation distortion.

6. Configuration of Front-End Circuit 4B in Modification 1

Figure 6A:
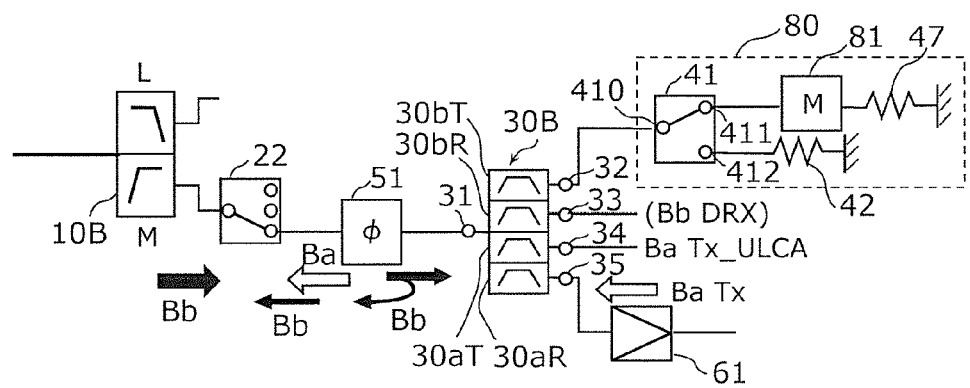
FIG. 6A is a circuit configuration diagram of a first circuit of a front-end module in Modification 1.

FIG. 6A is a circuit configuration diagram of the front-end circuit 4B of a front-end module in Modification 1. The difference between the front-end module in Modification 1 and the front-end module 1 in Example 1 is only in the configuration of the impedance variable circuit. Configurations common to the front-end module in Modification 1 and the front-end module 1 in Example 1 will be omitted from the following description, which will be given while focusing on distinctive features of the front-end module in Modification 1.

An impedance variable circuit 80 includes the switch 41 connected to the transmission terminal 32, a reflection circuit, and a matching circuit. The switch 41 is a second switch including: the common terminal 410 (a third common terminal) connected to the transmission terminal 32; the selection terminal 411 (a first selection terminal); and the selection terminal 412 (a second selection terminal). When the CA mode is selected, the second switch is set to the state in which the common terminal 410 is electrically connected to the selection terminal 411 and is not electrically connected to the selection terminal 412.

The reflection circuit includes a matching circuit 81 and a resistance element 47. With the matching circuit 81 being viewed from the selection terminal 411, the impedance of the matching circuit 81 is extremely lower than 50Ω or extremely higher than 50Ω. Thus, the reflection circuit functions in such a manner that signals in the transmission band of the band Bb that are transmitted through the front-end circuit 4B from the diplexer 10B toward the common terminal 410 are reflected when the common terminal 410 is electrically connected to the selection terminal 411.

The matching circuit includes the resistance element 42 for 50-ohm termination. The resistance element 42 is connected to the selection terminal 412. Thus, the matching circuit functions in such a way as to transmit or absorb signals in the transmission band of the band Bb when the common terminal 410 is electrically connected to the selection terminal 412.

The front-end module in Modification 1 is configured to form a connection between the reflection circuit and the quadplexer 30B via the transmission terminal 32 in the CA mode (two uplinks) for the bands Ba and Bb. With the transmission terminal 32 being viewed from the diplexer 10B side, the impedance state involves a large amount of reflection. Some transmission signal components in the band Bb may flow from the front-end circuit 4A and may enter the front-end circuit 4B through the switch 6. However, the aforementioned configuration enables more radio frequency components in the band Bb to be reflected off the quadplexer 30B. This enables a reduction in the amount of intermodulation distortion that would occur when signals in the band Ba and signals in the band Bb are simultaneously transmitted.

7. Configuration of Front-End Circuit 4B in Modification 2

Figure 6B:
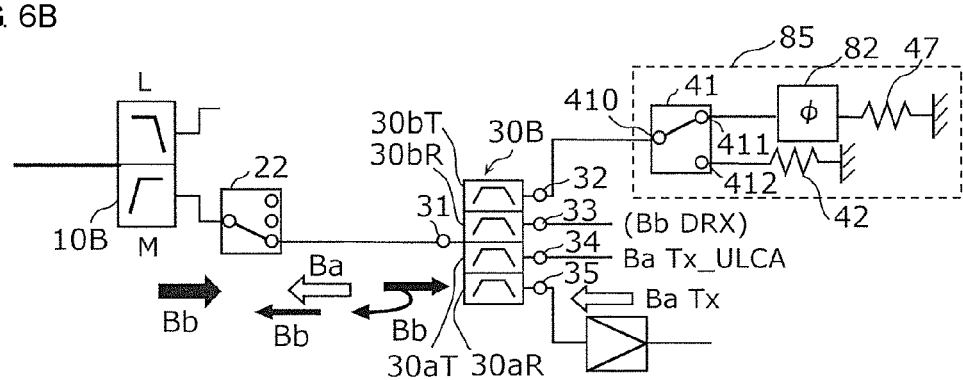
FIG. 6B is a circuit configuration diagram of a first circuit of a front-end module in Modification 2.

FIG. 6B is a circuit configuration diagram of the front-end circuit 4B of a front-end module in Modification 2. The front-end module in Modification 2 differs from the front-end module 1 in Example 1 in that no phase shifter is disposed between the switch 22 and the quadplexer 30B. Another difference between these front-end modules is in the configuration of the impedance variable circuit. Configurations common to the front-end module in Modification 2 and the front-end module 1 in Example 1 will be omitted from the following description, which will be given while focusing on distinctive features of the front-end module in Modification 2.

The front-end circuit 4B in Modification 2 is a first circuit including the diplexer 10B, the switch 21 (not illustrated), the switch 22, the switch 43 (not illustrated), the quadplexer 30B, an impedance variable circuit 85, and the reception amplifier circuit 61.

The impedance variable circuit 85 includes the switch 41 connected to the transmission terminal 32, a reflection circuit, and a matching circuit. The switch 41 is a second switch including: the common terminal 410 (a third common terminal) connected to the transmission terminal 32; the selection terminal 411 (a first selection terminal); and the selection terminal 412 (a second selection terminal). When the CA mode is selected, the second switch is set to the state in which the common terminal 410 is electrically connected to the selection terminal 411 and is not electrically connected to the selection terminal 412.

The reflection circuit includes a phase shifter 82 and the resistance element 47. The phase shifter 82 is a second phase shifter connected between the selection terminal 411 and the resistance element 47. With the quadplexer 30B side being viewed from the common terminal 31, the impedance is shifted from 50Ω owing to the phase shifter 82 acting on transmission waves in the band Bb that are transmitted from the diplexer 10B toward the common terminal 410. Consequently, waves in the band Bb that are reflected off the common terminal 31 may be increased. This enables a reduction in intermodulation distortion components that would be generated in the quadplexer 30B when signals in the band Ba and signals in the band Bb are simultaneously transmitted. Furthermore, the phase shifter 82 produces phase shifts in the reflected waves, which in turn cancel transmission waves in the band Bb. The occurrence of intermodulation distortion in the switch 22 is suppressed accordingly. This configuration eliminates or reduces the possibility that the reception sensitivity in the band Ba will degrade due to the occurrence of intermodulation distortion.

8. Configuration of Communication Device 9

The present disclosure embraces not only the front-end modules in Examples 1 to 3 and Modifications 1 and 2, but also a communication device 9 including any one of these front-end modules.

Figure 7:
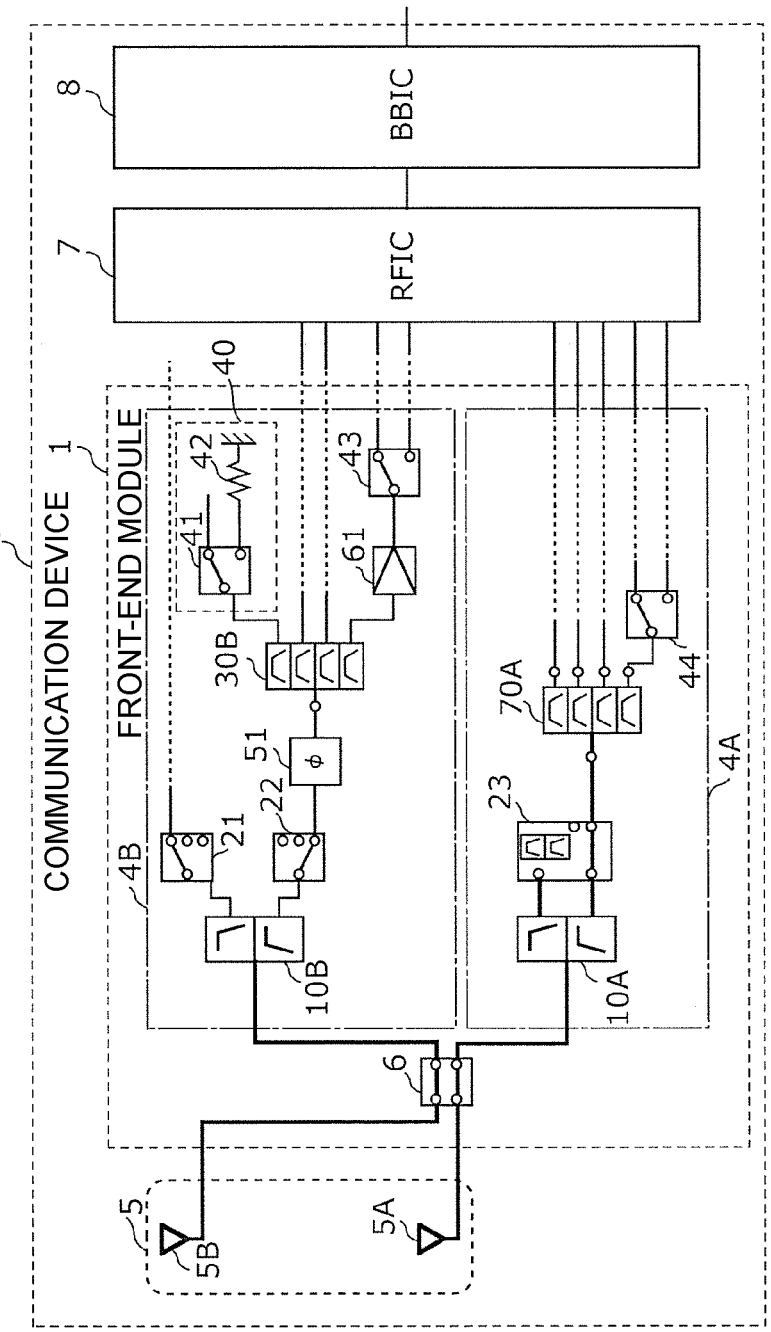
FIG. 7 is a schematic configuration diagram of a communication device according to an embodiment.

FIG. 7 is a schematic configuration diagram of the communication device 9 according to an embodiment. The communication device 9 illustrated in FIG. 7 includes the front-end module 1, the antenna unit 5, a radio-frequency signal processing circuit (radio-frequency integrated circuit (RFIC)) 7, and a baseband signal processing circuit (baseband integrated circuit (BBIC)) 8.

The front-end module 1 according to the present embodiment is the front-end module 1 in Example 1.

The radio-frequency signal processing circuit 7 performs signal processing such as down-conversion on radio-frequency reception signals input from the antenna unit 5 through a reception-side signal path and outputs the resultant reception signals to the baseband signal processing circuit 8.

The radio-frequency signal processing circuit 7 is, for example, a radio-frequency integrated circuit (RFIC). The radio-frequency signal processing circuit 7 performs signal processing such as up-conversion on transmission signals input from the baseband signal processing circuit 8 and outputs the resultant radio-frequency signals to the front-end module 1.

The baseband signal processing circuit 8 is a circuit that process signals of frequencies lower than the frequencies used by the radio-frequency signals in the front-end module 1. The signals processed by the baseband signal processing circuit 8 are used, for example, to display an image or to enable a telephone conversation through a speaker.

Although the connection relationship between the front-end module 1 and the radio-frequency signal processing circuit 7 is not explicitly illustrated in FIG. 7, components such as a switch circuit, a low-noise amplifier circuit, and a power amplifier circuit are disposed, as appropriate, between the front-end module 1 and the radio-frequency signal processing circuit 7.

The communication device 9 may include the front-end module 2 in Example 2, the front-end module 3 in Example 3, the front-end module in Modification 1, or the front-end module in Modification 2 in place of the front-end module 1 in Example 1. It is not always required that the communication device 9 includes the antenna unit 5 or the baseband signal processing circuit (baseband integrated circuit (BBIC)) 8.

Thus, a front-end system supporting the CA mode (two uplinks) is provided with a communication device that enables a reduction in the amount of intermodulation distortion associated with two different transmission signals and mitigates degradation of reception sensitivity.

Effects

The front-end module 1 in Example 1 supports the CA mode involving simultaneous transmission of signals in the band Ba and signals in the band Bb. The bands Ba and Bb belong to the middle-band group. The front-end module 1 includes: the front-end circuit 4B that selectively transmits signals in the band Ba when the CA mode is selected; the front-end circuit 4A that selectively transmits signals in the band Bb when the CA mode is selected; and the switch 6 disposed between the antenna unit 5 and each of the front-end circuits 4A and 4B. The front-end circuit 4B includes the quadplexer 30B for the bands Ba and Bb. The front-end circuit 4A includes the quadplexer 70A for the bands Ba and Bb. The front-end circuit 4B further includes the switch 41, the reflection circuit, and the matching circuit. The common terminal 410 of the switch 41 is connected to the transmission terminal that is included in the quadplexer 30B and corresponds to the band Bb. When the CA mode is selected, the switch 41 is set to the state in which the common terminal 410 is electrically connected to the selection terminal 411 and is not electrically connected to the selection terminal 412. The reflection circuit is connected to the selection terminal 411. When the common terminal 410 is electrically connected to the selection terminal 411, the reflection circuit causes reflection of signal components in the band Bb that are transmitted from the switch 6 toward the common terminal 410. The matching circuit is connected to the selection terminal 412. When the common terminal 410 is electrically connected to the selection terminal 412, the matching circuit transmits or absorbs signal components in the band Bb.

In the CA mode, this configuration forms a connection between the reflection circuit and the quadplexer 30B via the transmission terminal for the band Bb. With the transmission terminal for the band Bb being viewed from the common terminal 31 side, the impedance thus involves a large amount of reflection accordingly. Some signal components in the band Bb may flow from the front-end circuit 4A and may enter the front-end circuit 4B. However, the aforementioned configuration enables more signal components in the band Bb to be reflected off the quadplexer 30B. This enables a reduction in the amount of intermodulation distortion that would occur when signals in the band Ba and signals in the band Bb are simultaneously transmitted.

The front-end module 1 in Example 1 may further include: the switch 22 disposed between the switch 6 and the quadplexer 30B to shift the phase of each transmission signal component in the band Bb; and the phase shifter 51 disposed between the switch 22 and the quadplexer 30B to shift the phase of each transmission signal component in the band Bb.

This configuration creates a phase difference between a band-Bb transmission signal component flowing from the front-end circuit 4A into the front-end circuit 4B and a band-Bb transmission signal component reflected off the quadplexer 30B and bouncing back to the switch 22. Consequently, the two signals in the band Bb cancel each other. The occurrence of intermodulation distortion in the switch 22 is suppressed accordingly.

The front-end module 3 in Example 3 supports the CA mode involving simultaneous transmission of signals in the band Ba and signals in the band Bb. The bands Ba and Bb belong to the middle-band group. The front-end module 3 includes: the front-end circuit 4E that selectively transmits signals in the band Ba when the CA mode is selected; the front 4D that selectively transmits signals in the band Bb when the CA mode is selected; and the switch 6 disposed between the antenna unit 5 and each of the front-end circuits 4D and 4E. The front-end circuit 4E includes the quadplexer 70A for the bands Ba and Bb. The front-end circuit 4D includes the quadplexer 30B for the bands Ba and Bb. The front-end circuit 4E further includes the switch 46, the reflection circuit, and the matching circuit. The common terminal 460 of the switch 46 is connected to the transmission terminal that is included in the quadplexer 70A and corresponds to the band Bb. When the CA mode is selected, the switch 46 is set to the state in which the common terminal 460 is electrically connected to the selection terminal 461 and is not electrically connected to the selection terminal 462. The reflection circuit is connected to the selection terminal 461. When the common terminal 460 is electrically connected to the selection terminal 461, the reflection circuit causes reflection of signal components in the band Bb that are transmitted from the switch 6 toward the common terminal 460. The matching circuit is connected to the selection terminal 462. When the common terminal 460 is electrically connected to the selection terminal 462, the matching circuit transmits or absorbs signal components in the band Bb.

In the CA mode, this configuration forms a connection between the reflection circuit and the quadplexer 70A via the transmission terminal for the band Bb. With the transmission terminal for the band Bb being viewed from the common terminal 71 side, the impedance thus involves a large amount of reflection accordingly. Some signal components in the band Bb may flow from the front-end circuit 4D and may enter the front-end circuit 4E. However, the aforementioned configuration enables more signal components in the band Bb to be reflected off the quadplexer 70A. This enables a reduction in the amount of intermodulation distortion that would occur when signals in the band Ba and signals in the band Bb are simultaneously transmitted.

The front-end module 3 in Example 3 may further include: the switch module 23 disposed between the switch 6 and the quadplexer 70A; and the phase shifter 52 disposed between the switch module 23 and the quadplexer 70A to shift the phase of each transmission signal component in the band Bb.

This configuration creates a phase difference between a band-Bb transmission signal component flowing from the front-end circuit 4D into the front-end circuit 4E and a band-Bb transmission signal component reflected off the quadplexer 70A and bouncing back to the switch module 23. Consequently, the two signals in the band Bb cancel each other. The occurrence of intermodulation distortion in the switch module 23 is suppressed accordingly.

Other Embodiments

The front-end modules and the communication device according to the embodiments above have been described so far by citing examples and modifications thereof. However, the front-end module and the communication device according to the present disclosure are not limited to the examples and modifications thereof. The present disclosure embraces other embodiments implemented by varying combinations of constituent components of the examples and modifications above, other modifications achieved through various alterations to the examples above and modifications thereof that may be conceived by those skilled in the art within a range not departing from the spirit of the present disclosure, and various types of apparatuses including the front-end module and the communication device disclosed herein.

In each of the front-end modules and the communication devices according to the examples and modifications thereof, the paths forming connections between the circuit elements and the signal paths illustrated in the drawings may also include, for example, other radio-frequency circuit elements and wiring.

INDUSTRIAL APPLICABILITY

The present disclosure may be widely used as front-end modules having multi-band and multi-mode features for the adoption of the carrier aggregation scheme and may be included in communication devices such as mobile phones.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A front-end module supporting a carrier aggregation (CA) mode that involves simultaneous transmission of signals in a first frequency band and signals in a second frequency band, the first frequency band and the second frequency band being different frequency bands belonging to a first frequency band group, the front-end module comprising:
   a first circuit that selectively transmits signals in the first frequency band when the CA mode is selected;
   a second circuit that selectively transmits signals in the second frequency band when the CA mode is selected; and
   a first switch disposed between each of at least two antennas and each of the first and second circuits, the first switch configured to switch connections between each of the at least two antennas and each of the first circuit and the second circuit, wherein
   the first circuit includes a first multiplexer including
      (1) a first transmitting filter connected to a first common terminal and to a first transmission terminal, a pass band of the first transmitting filter being a first transmission band included in the first frequency band,
      (2) a first receiving filter connected to the first common terminal and to a first reception terminal, a pass band of the first receiving filter being a first reception band included in the first frequency band,
      (3) a second transmitting filter connected to the first common terminal and to a second transmission terminal, a pass band of the second transmitting filter being a second transmission band included in the second frequency band, and
      (4) a second receiving filter connected to the first common terminal and to a second reception terminal, a pass band of the second receiving filter being a second reception band included in the second frequency band,
   the second circuit includes a second multiplexer including
      (1) a third transmitting filter connected to a second common terminal and to a third transmission terminal, a pass band of the third transmitting filter being the first transmission band,
      (2) a third receiving filter connected to the second common terminal and to a third reception terminal, a pass band of the third receiving filter being the first reception band,
      (3) a fourth transmitting filter connected to the second common terminal and to a fourth transmission terminal, a pass band of the fourth transmitting filter being the second transmitting band, and
      (4) a fourth receiving filter connected to the second common terminal and to a fourth reception terminal, a pass band of the fourth receiving filter being the second reception band, and
   the first circuit further includes an impedance variable circuit connected to the second transmission terminal, the impedance variable circuit being configured to cause, in the CA mode, reflection of signal components in the second transmission band that are transmitted from the first switch toward the first multiplexer.

2. The front-end module according to claim 1, wherein the impedance variable circuit includes:
   a second switch that includes a third common terminal connected to the second transmission terminal, a first selection terminal, and a second selection terminal, the third common terminal being electrically connected to the first selection terminal and being not electrically connected to the second selection terminal when the CA mode is selected;
   a reflection circuit connected to the first selection terminal, the reflection circuit causing reflection of signal components in the second transmission band that are transmitted from the first switch toward the third common terminal when the third common terminal is electrically connected to the first selection terminal; and
   a matching circuit connected to the second selection terminal, the matching circuit being configured to transmit or absorb signal components in the second transmission band when the third common terminal is electrically connected to the second selection terminal.

3. The front-end module according to claim 2, further comprising:
a reception amplifier circuit that includes an input terminal and an output terminal, the reception amplifier circuit being configured to amplify reception signals in the first reception band, wherein the input terminal is connected to the first reception terminal; and
a fourth switch that includes a fourth common terminal, a third selection terminal, and a fourth selection terminal, the fourth common terminal being connected to the output terminal, wherein
the matching circuit is a 50-ohm resistor connected to the second selection terminal,
the first transmission terminal is a transmission terminal for the first transmission band in the CA mode,
the third selection terminal is a reception terminal for the first reception band in the CA mode,
the fourth selection terminal is a reception terminal for the first reception band in a non- CA involving transmission and reception of signals in the first frequency band or transmission and reception of signals in the second frequency band, and
the second reception signal is a reception terminal for the second reception band in the non-CA mode.

4. The front-end module according to claim 2, further comprising a fifth switch that includes a fifth common terminal, a fifth selection terminal, and a sixth selection terminal, the fifth common terminal being connected to the second reception terminal, wherein
the reflection circuit is a transmission amplifier circuit connected to the second selection terminal, the transmission amplifier circuit being configured to amplify transmission signals in the second transmission band,
the first transmission terminal is a transmission terminal for the first transmission band in the CA mode and in a non-CA mode that involves transmission and reception of signals in the first frequency band or transmission and reception of signals in the second frequency band,
the first reception terminal is a reception terminal for the first reception band in the CA mode and in the non-CA mode,
the fifth selection terminal is a reception terminal for the second reception band in the non-CA mode, and
the sixth selection terminal is a reception terminal for the second reception band in the CA mode.

5. The front-end module according to claim 1, wherein the first circuit further includes:
a third switch disposed between the first switch and the first multiplexer; and
a first phase shifter disposed between the third switch and the first multiplexer, the first phase shifter being configured to shift a phase of a signal component in the second transmission band.

6. The front-end module according to claim 2, wherein the first circuit further includes:
a third switch disposed between the first switch and the first multiplexer; and
a first phase shifter disposed between the third switch and the first multiplexer, the first phase shifter being configured to shift a phase of a signal component in the second transmission band.

7. The front-end module according to claim 3, wherein the first circuit further includes:
a third switch disposed between the first switch and the first multiplexer; and
a first phase shifter disposed between the third switch and the first multiplexer, the first phase shifter being configured to shift a phase of a signal component in the second transmission band.

8. The front-end module according to claim 4, wherein the first circuit further includes:
a third switch disposed between the first switch and the first multiplexer; and
a first phase shifter disposed between the third switch and the first multiplexer, the first phase shifter being configured to shift a phase of a signal component in the second transmission band.

9. The front-end module according to claim 2, wherein
the first circuit further includes a third switch disposed between the first switch and the first multiplexer, and
the reflection circuit includes a resistance element and a second phase shifter connected between the first selection terminal and the resistance element.

10. The front-end module according to claim 1, wherein a frequency at which intermodulation distortion occurs in the first multiplexer due to interference between a signal in the first transmission band and a signal in the second transmission band is included in the first reception band.

11. The front-end module according to claim 2, wherein a frequency at which intermodulation distortion occurs in the first multiplexer due to interference between a signal in the first transmission band and a signal in the second transmission band is included in the first reception band.

12. The front-end module according to claim 1, further comprising a first wave separator disposed between the first switch and the first multiplexer, the first wave separator being configured to separate signals into signals in the first frequency band group and signals in the second frequency band group different from the first frequency band group.

13. The front-end module according to claim 2, further comprising a first wave separator disposed between the first switch and the first multiplexer, the first wave separator being configured to separate signals into signals in the first frequency band group and signals in the second frequency band group different from the first frequency band group.

14. The front-end module according to claim 5, further comprising a first wave separator disposed between the first switch and the first multiplexer, the first wave separator being configured to separate signals into signals in the first frequency band group and signals in the second frequency band group different from the first frequency band group.

15. The front-end module according to claim 1, wherein
the first frequency band is a long term evolution (LTE) Band 1 including the first transmission band: 1,920 to 1,980 MHz and the first reception band: 2,110 to 2,170 MHz,
the second frequency band is an LTE Band 3 including the second transmission band: 1,710 to 1,785 MHz and the second reception band: 1,805 to 1,880 MHz, and
a frequency at which third-order intermodulation distortion occurs due to interference between a signal in the first transmission band and a signal in the second transmission band is included in the first reception band.

16. The front-end module according to claim 2, wherein
the first frequency band is a long term evolution (LTE) Band 1 including the first transmission band: 1,920 to 1,980 MHz and the first reception band: 2,110 to 2,170 MHz,
the second frequency band is an LTE Band 3 including the second transmission band: 1,710 to 1,785 MHz and the second reception band: 1,805 to 1,880 MHz, and a frequency at which third-order intermodulation distortion occurs due to interference between a signal in the first transmission band and a signal in the second transmission band is included in the first reception band.

17. The front-end module according to claim 5, wherein the first frequency band is a long term evolution (LTE) Band 1 including the first transmission band: 1,920 to 1,980 MHz and the first reception band: 2,110 to 2,170 MHz,
the second frequency band is an LTE Band 3 including the second transmission band: 1,710 to 1,785 MHz and the second reception band: 1,805 to 1,880 MHz, and
a frequency at which third-order intermodulation distortion occurs due to interference between a signal in the first transmission band and a signal in the second transmission band is included in the first reception band.

18. The front-end module according to claim 5, wherein the first frequency band is a long term evolution (LTE) Band 1 including the first transmission band: 1,920 to 1,980 MHz and the first reception band: 2,110 to 2,170 MHz,
the second frequency band is an LTE Band 3 including the second transmission band: 1,710 to 1,785 MHz and the second reception band: 1,805 to 1,880 MHz, and
a frequency at which third-order intermodulation distortion occurs due to interference between a signal in the first transmission band and a signal in the second transmission band is included in the first reception band.

19. A communication device comprising:
a radio-frequency signal processing circuit that processes radio-frequency signals transmitted or received via at least two antennas; and
a front-end module disposed between the radio-frequency signal processing circuit and each of the at least two antennas and supporting a carrier aggregation (CA) mode that involves simultaneous transmission of signals in a first frequency band and signals in a second frequency band, the first frequency band and the second frequency band being different frequency bands belonging to a first frequency band group, the front-end module comprising:
a first circuit that selectively transmits signals in the first frequency band when the CA mode is selected;
a second circuit that selectively transmits signals in the second frequency band when the CA mode is selected; and
a first switch disposed between each of the at least two antennas and each of the first and second circuits, the first switch configured to switch connections between each of the at least two antennas and each of the first circuit and the second circuit, wherein
the first circuit includes a first multiplexer including
(1) first transmitting filter connected to a first common terminal and to a first transmission terminal, a pass band of the first transmitting filter being a first transmission band included in the first frequency band,
(2) first receiving filter connected to the first common terminal and to a first reception terminal, a pass band of the first receiving filter being a first reception band included in the first frequency band,
(3) a second transmitting filter connected to the first common terminal and to a second transmission terminal, a pass band of the second transmitting filter being a second transmission band included in the second frequency band, and
(4) a second receiving filter connected to the first common terminal and to a second reception terminal, a pass band of the second receiving filter being a second reception band included in the second frequency band,
the second circuit includes a second multiplexer including
(1) a third transmitting filter connected to a second common terminal and to a third transmission terminal, a pass band of the third transmitting filter being the first transmission band,
(2) a third receiving filter connected to the second common terminal and to a third reception terminal, a pass band of the third receiving filter being the first reception band,
(3) a fourth transmitting filter connected to the second common terminal and to a fourth transmission terminal, a pass band of the fourth transmitting filter being the second transmitting band, and
(4) a fourth receiving filter connected to the second common terminal and to a fourth reception terminal, a pass band of the fourth receiving filter being the second reception band, and
the first circuit further includes an impedance variable circuit connected to the second transmission terminal, the impedance variable circuit being configured to cause, in the CA mode, reflection of signal components in the second transmission band that are transmitted from the first switch toward the first multiplexer.

20. A communication device comprising:
a radio-frequency signal processing circuit that processes radio-frequency signals transmitted or received via at least two antennas; and
a front-end module disposed between the radio-frequency signal processing circuit and each of the at least two antennas and supporting a carrier aggregation (CA) mode that involves simultaneous transmission of signals in a first frequency band and signals in a second frequency band, the first frequency band and the second frequency band being different frequency bands belonging to a first frequency band group, the front-end module comprising:
a first circuit that selectively transmits signals in the first frequency band when the CA mode is selected;
a second circuit that selectively transmits signals in the second frequency band when the CA mode is selected; and
a first switch disposed between each of the at least two antennas and each of the first and second circuits, the first switch configured to switch connections between each of the at least two antennas and each of the first circuit and the second circuit, wherein
the first circuit includes a first multiplexer including
(1) a first transmitting filter connected to a first common terminal and to a first transmission terminal, a pass band of the first transmitting filter being a first transmission band included in the first frequency band,
(2) a first receiving filter connected to the first common terminal and to a first reception terminal, a pass band of the first receiving filter being a first reception band included in the first frequency band,
(3) a second transmitting filter connected to the first common terminal and to a second transmission terminal, a pass band of the second transmitting filter being a second transmission band included in the second frequency band, and (4) a second receiving filter connected to the first common terminal and to a second reception terminal, a pass band of the second receiving filter being a second reception band included in the second frequency band, the second circuit includes a second multiplexer including (1) a third transmitting filter connected to a second common terminal and to a third transmission terminal, a pass band of the third transmitting filter being the first transmission band, (2) a third receiving filter connected to the second common terminal and to a third reception terminal, a pass band of the third receiving filter being the first reception band, (3) a fourth transmitting filter connected to the second common terminal and to a fourth transmission terminal, a pass band of the fourth transmitting filter being the second transmission band, and (4) a fourth receiving filter connected to the second common terminal and to a fourth reception terminal, a pass band of the fourth receiving filter being the second reception band, and the first circuit further includes an impedance variable circuit connected to the second transmission terminal, the impedance variable circuit being configured to cause, in the CA mode, reflection of signal components in the second transmission band that are transmitted from the first switch toward the first multiplexer, wherein the impedance variable circuit includes:

a second switch that includes a third common terminal connected to the second transmission terminal, a first selection terminal, and a second selection terminal, the third common terminal being electrically connected to the first selection terminal and being not electrically connected to the second selection terminal when the CA mode is selected;

a reflection circuit connected to the first selection terminal, the reflection circuit causing reflection of signal components in the second transmission band that are transmitted from the first switch toward the third common terminal when the third common terminal is electrically connected to the first selection terminal; and a matching circuit connected to the second selection terminal, the matching circuit being configured to transmit or absorb signal components in the second transmission band when the third common terminal is electrically connected to the second selection terminal.

* * * * *